Jan. 2, 1962 W. F. BAILEY 3,015,763

SIGNAL-TRANSLATING DEVICE

Filed March 8, 1956

United States Patent Office 3,015,763

Patented Jan. 2, 1962

3,015,763
SIGNAL-TRANSLATING DEVICE

William F. Bailey, Valley Stream, N.Y., assignor to Hazeltine Research, Inc., Chicago, Ill., a corporation of Illinois Filed Mar. 8, 1956, Ser. No. 570,347
5 Claims. (Cl. 317—235)

*General*

The present invention is directed to new and improved signal-translating devices and, more particularly, to semiconductor signal-translating devices such as multiple-unit junction transistors. While such transistors have a variety of applications, they are particularly useful as cascade-connected transistor amplifiers of a type which exhibits little interaction between their input and output circuits. Accordingly, the multiple-unit transistors of the present invention will be described in that general environment.

For many applications, transistor amplifier stages have been connected in cascade in various ways to secure the over-all gain and other benefits of a plurality of such stages. One such combination comprises the grounded emitter stage which is either transformer coupled or coupled through a resistor-condenser network to another grounded emitter transistor stage. While such a cascade combination has proved to be useful without neutralization for some purposes, such as low-frequency applications, that combination has not always afforded adequate isolation between its input and output circuits when used in certain environments such as in the intermediate-frequency amplifier portion of a radio receiver. Neutralization of transistor circuits is often very critical of adjustment and requires the use of extra circuit components which undesirably increase the cost of the receiver. Neutralization in transistor circuits is considerably more difficult than in vacuum-tube circuits because of the inherent internal resistance existing between the external base connection and the effective or internal base terminal of transistors. This internal resistance may be as much as several hundred ohms. Feedback exists by way of this resistor and the problem of neutralization is ordinarily difficult because a physical connection cannot be made to this internal base terminal. The state of the art of manufacturing transistors today is such that transistors are not made with electrical characteristics that are as uniform as those of electron tubes. Because of these non-uniformities, the values of circuit components required to effect neutralization in transistor circuits may vary from radio set to radio set. Selection of these components is time consuming and, by impeding mass production, undesirably increases the cost of radio receivers. Furthermore, this operation fosters high service costs when it becomes necessary to replace transistors after a set has been in operation for a period of time. Neutralization requirements may vary with temperature changes so that circuit components which provide optimum neutralization at one temperature are not nearly as effective at another operating temperature.

A type of amplifier employing a pair of cascade-connected triode electron-tube devices wherein the cathode of the first stage is grounded and the signal input to a second stage is applied between its cathode and its grounded control electrode is commonly referred to as a "cascode" amplifier. Such an amplifier is characterized by its high amplification and good isolation between its input and output circuits. Insofar as applicant is aware, prior to the invention described and claimed in the co-pending application of Richard J. Farber and Alexander Proudfit, Serial No. 567,278, filed February 23, 1956, and entitled "Signal-Translating System," and now abandoned, it had not been appreciated that such advantages could be realized with cascade-connected transistors nor had practical circuits been constructed which attained such results.

In the above-identified application there is described and claimed a signal-translating system making use of a multiple-unit junction transistor as a two-stage intermediate-frequency amplifier for a radio receiver. That multiple-unit transistor comprises an integral stack of five semi-conductive layers, alternate ones of which are of opposite conductivity types. The third or middle layer serves not only as a collector for the first transistor but also as an emitter for the second transistor and thereby eliminates the need for external conductive connections therebetween. While such multiple-unit transistors are very useful, a more inexpensive multiple-unit transistor may be desired for some applications.

It is an object of the invention, therefore, to provide a new and improved semiconductor signal-translating device which avoids one or more of the above-mentioned limitations of prior such devices.

It is another object of the invention to provide a new and improved multiple-unit transistor which is relatively simple in construction and inexpensive to manufacture.

It is a further object of the invention to provide a new and improved multiple-unit transistor which may be manufactured quite readily from a single alloy junction transistor.

It is an additional object of the invention to provide a new and improved multiple-unit junction transistor which is particularly useful in an inherently neutralized cascade-connected transistor amplifier.

In accordance with a particular form of the invention, a signal-translating device comprises a body of semiconductive material having therein a relatively flat surfaced intermediate zone of one conductivity type between and contiguous with a pair of outer zones of the opposite conductivity type, the body having a slot extending obliquely through the intermediate zone and one of the outer zones, thereby to define two junction transistor units for which the other of the outer zones constitutes an electrically common collector and emitter region and the portions of the intermediate and one outer zone on one side of the slot constitute base and emitter regions respectively and the portions of the intermediate and the one outer zone on the other side of the slot constitute base and collector regions respectively.

Further in accordance with the invention, the method of making a multiple-unit transistor having an electrically common collector and emitter zone from a single junction transistor unit having an intermediate base zone and a pair of outer emitter and collector zones and having its emitter base junction symmetrically disposed with respect to its collector base junction comprises forming a slot in the aforesaid single transistor unit which extends obliquely through the above-mentioned intermediate base zone and one of the aforesaid outer zones thereof.

For a better understanding of the present invention, together with other and further objects thereof, reference is had to the following description taken in connection with the accompanying drawing, and its scope will be pointed out in the appended claims.

Referring to the drawing.

Figure 1:
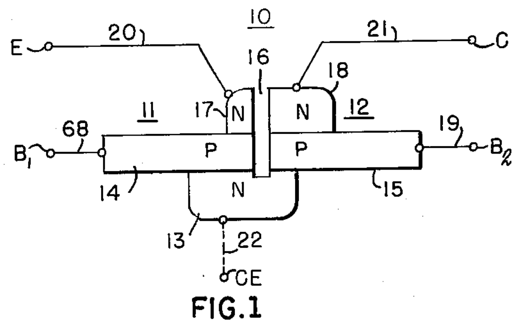
FIG. 1 is an elevational view of a signal-translating device in accordance with a particular form of the invention.

*Description of signal-translating device of FIG. 1*

Referring now to FIG. 1 of the drawing, the signal-translating device there represented comprises a compound transistor 10 effectively including a pair of junction transistor units 11 and 12 having an electrically common collector and emitter zone or region 13, two base zones 14 and 15 separated by a narrow slot 16 which is normal to the flat surfaces of the base zones, an emitter zone 17, and a collector zone 18 separated from the latter by that slot. It will be understood that these transistor units may be of the grown junction type, the alloy junction type, or other suitable junction types. For convenience, it will be assumed that both units are of the N-P-N alloy junction type. The compound transistor 10 may be constructed from a single alloy junction transistor by cutting the slot 16 as illustrated by a diamond saw or other suitable means so that the entire body of semiconductive material of the transistor has a first zone of one conductivity type, namely zone 13, a first pair of spaced zones 14, 15 of the opposite conductivity type contiguous with one surface of the zone 13, and a second pair of spaced zones 17, 18 of the aforesaid one type individually contiguous with individual ones of the first pair of spaced zones 14 and 15. The compound transistor 10 preferably has such a geometry that the collector base junction of each unit 11 and 12 has a greater area than that of its corresponding emitter base junction. Accordingly, zone 13 is displaced laterally to the left with reference to the zones 17 and 18, as represented. Both of the junctions of each unit are ordinarily symmetrically disposed with respect to its collector zone. To that end, the intermediate zones 14 and 15 are relatively flat members of substantially uniform thickness.

The transistor 10 also includes individual external circuit connections made only to individual ones of the first and second pairs of zones 14, 15 and 17, 18. Circuit connections 68 and 19 are connected in a conventional manner to the base regions and their terminals are designated $B_1$ and $B_2$, respectively, while connections 20 and 21 are connected to the emitter and collector zones 17 and 18, respectively. The external terminals of connections 20 and 21 are designated E and C, respectively. For some applications, it may be desirable to include an additional connection 22, represented in broken line construction, which is made to the electrically common collector and emitter zone 13 and has an external terminal designated CE.

Figure 2:
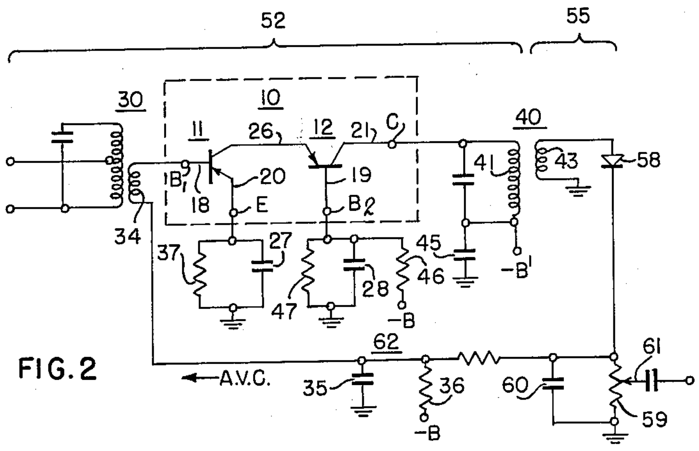
FIG. 2 is a circuit diagram of an intermediate amplifier and detector employing therein a signal-translating device embodying the present invention.

*Description of FIG. 2 amplifier and detector*

In FIG. 2 there is represented the circuit diagram of a practical embodiment of a cascade-connected intermediate-frequency amplifier 52 and a modulation-signal detector 55 for a radio receiver including the signal-translating device or multiple-unit transistor 10 of FIG. 1. The amplifier 52, which is fully described and claimed in the above-identified application of Richard J. Farber and Alexander Proudfit, includes an input transformer 30 having one terminal of its secondary winding 34 coupled to the base terminal $B_1$ of the first transistor unit 11 and having its other terminal connected to ground through an audio-frequency by-pass condenser 35 forming a portion of an audio-frequency filter network 62. The emitter terminal E of the transistor unit 11 is effectively maintained at ground potential for intermediate-frequency wave signals by a condenser 27 connected in parallel with a resistor 37. The emitter-to-base junction of transistor unit 11 is biased slightly positive, that is in the forward direction, by a biasing means including the secondary winding 34, a resistor 36 connected to a potential source indicated as −B, and the resistor 37. The collector electrode of the transistor unit 11 is represented in the FIG. 2 circuit diagram as being connected directly to the emitter electrode of the second transistor unit 12 of the cascade-connected combination by a conductor 26 although it will be clear from FIG. 1 that the zone 13 is a common emitter and collector zone for the transistor 10 and, hence, actually requires no coupling elements therebetween.

The base zone of the transistor unit 12 is maintained at ground potential for intermediate-frequency wave signals by a by-pass condenser 28 connected in parallel with a resistor 47. A source −B is connected through a resistor 46 to the base terminal $B_2$ of transistor unit 12 while a similar source −B′ is connected to the collector terminal C of that transistor unit through the tuned winding 41 of an output transformer 40. A by-pass condenser 45 is connected across the source −B′. The values of the resistors 46 and 47 are selected in relation to the potentials of the sources −B and −B′ so that the collector zone of transistor unit 12 is biased in the reverse direction.

The output winding 43 of transformer 40 is in the circuit of the detector 55 and is connected to ground through a crystal rectifier device 58 and its load impedance comprising the parallel combination of load resistor 59 and condenser 60. Modulation components are derived at the adjustable tap 61 on the resistor 59. A relatively smooth AVC potential is developed by the filter 62 from the average value of the carrier and is applied through the winding 34 to the base zone of the transistor 11.

*Operation of transistor amplifier of FIG. 2*

The operation of the intermediate-frequency amplifier 52 and the detector 55 is explained in detail in the above-mentioned copending application. More briefly considered, however, the intermediate-frequency wave signal applied to the base zone of transistor unit 11 is translated in the well-known manner to the collector zone in the output circuit of that unit. The input circuit of transistor unit 12 comprises its emitter and base zones, the latter zone being grounded for intermediate-frequency wave signals by the condenser 28. Since the collector zone of transistor unit 11 is effectively integral with the emitter zone of transistor unit 12, the output circuit of the first-mentioned unit and the input circut of the second are electrically tied together. The input impedance of a grounded base transistor is inherently low. Accordingly, the output load impedance of transistor unit 11 is effectively the low impedance of the second transistor unit 12. Since this impedance is low, the voltage that can be developed in the output circuit of transistor unit 11 is correspondingly low and thus a relatively small voltage is available for feeding back voltage to the input circuit of unit 11. For these reasons any difficulties which might be encountered as a result of feedback from the input circuit of the second stage of unit 12 to the first stage of unit 11 are minimized. The current gain of the grounded emitter transistor unit 11 is its $\beta$ gain and this is quite high.

The signal applied to the input circuit of transistor unit 12 is translated to its high-impedance output circuit where it is resonated in the tuned input circuit of the transformer 40. Because of the difference between the input impedance and the output impedance of transistor unit 12, a voltage gain and a power gain result at its collector or output circuit and an amplified intermediate-frequency signal is applied by the secondary winding 43 of transformer 40 to the detector 55. The latter derives the modulation components in the usual manner and the filter 62 derives from those components a gain control or AVC potential for application to the base of transistor unit 11. Since the output circuit of transistor unit 11 is conductively tied to the input circuit of transistor unit 12, the AVC potential simultaneously controls the gain of each of the transistor units rather than the gain of just one thereof as is the usual case for conventional cascade-connnected transistor units. Since the base of transistor unit 12 is at ground potential for intermediate-frequency signals, the grounded base affords by its electrostatic shielding action additional isolation between the input circuit of transistor unit 11 and the output circuit of transistor unit 12 thus preventing undesirable feedback or transfer of energy from the high-voltage output circuit of the two-stage amplifier to its input circuit. It will be seen that amplification is accomplished without any neutralizing circuits which are critical of adjustment and also without requiring additional circuit components that only increase the cost of the intermediate-frequency amplifier 52. While the gain of the amplifier 52 may be somewhat less than that obtained with a conventional neutralized intermediate-frequency amplifier, such as one employing a pair of cascaded grounded emitter stages, the gain is satisfactory for use in radio broadcast receivers.

Figure 3:
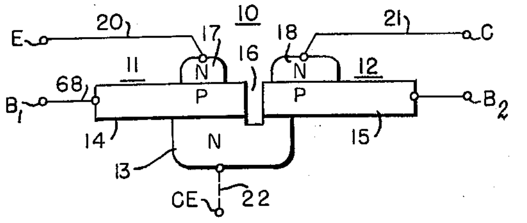
FIG. 3 is an elevational view of another embodiment of the invention.

*Description of compound transistor of FIG. 3*

Referring now to FIG. 3 of the drawing, there is represented a compound transistor which is quite similar to that illustrated in FIG. 1. Accordingly, corresponding elements are designated by the same reference characters. In the FIG. 3 embodiment, the slot 16 extends only between the two base zones 14 and 15. The emitter and collector zones 17 and 18, respectively, constitute small discrete regions suitably spaced from each other so that it is unnecessary to employ a slot to separate them. The area of zone 18 in contact with the base zone 15 is perferably larger than that of zone 17 in contact with base zone 14. The operation of the FIG. 3 compound transistor is essentially the same as that of the FIG. 1 device and, hence, need not be explained.

Figure 4:
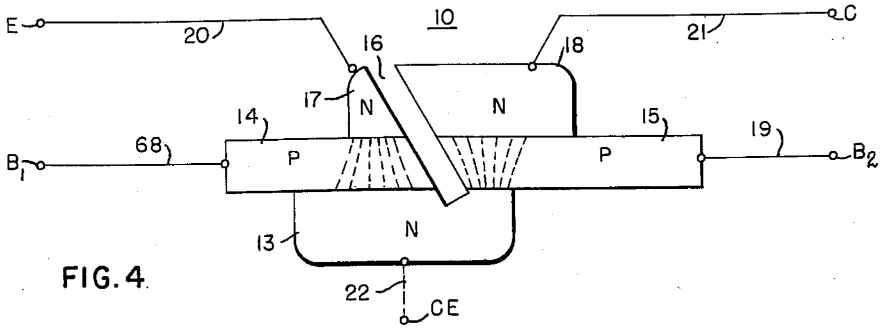
FIG. 4 is a similar enlarged view of another modification of the present invention.

*Description of compound transistor of FIG. 4*

The enlarged elevational view of FIG. 4 represents a compound transistor similar to those previously described. Hence, corresponding elements are designated by the same reference characters. This transistor differs from the others in that the slot 16 extends obliquely through the zones 17, 18 and 14, 15. An important advantage results when the compound transistor has the configuration represented in FIG. 4. The current flow between an emitter base junction and its corresponding collector base junction is as represented by the dotted lines. It will be noted that the current flow tends to spread. A higher $\alpha$ gain may be realized when the configuration of the transistor permits a larger amount of emitter current to reach the collector. This is accomplished in the FIG. 4 embodiment by displacing the various portions of the transistor as represented and by cutting an oblique slot as shown thus enhancing the over-all gain of the compound transistor.

While there have been described what are at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A signal-translating device comprising: a body of semiconductive material having therein a relatively flat surfaced intermediate zone of one conductivity type between and contiguous with a pair of outer zones of the opposite conductivity type, said body having a slot extending obliquely through said intermediate zone and one of said outer zones, thereby to define two junction transistor units for which the other of said outer zones constitutes an electrically common collector and emitter region and the portions of said intermediate and one outer zone on one side of said slot constitute base and emitter regions respectively and the portions of said intermediate and said one outer zone on the other side of said slot constitute base and collector regions respectively.

2. A signal-translating device comprising: a pair of junction transistor units having an electrically common collector and emitter zone, two base zones, an emitter zone, and a collector zone; the collector base junction of each unit having a greater area than that of its corresponding emitter base junction.

3. A signal-translating device comprising: a pair of junction transistor units having an electrically common collector and emitter zone, two base zones, an emitter zone, and a collector zone; the collector base junction of each unit having a greater area than that of its corresponding emitter base junction; and both of said junctions of each unit being symmetrically disposed with respect to the corresponding collector zone thereof.

4. A signal-translating device comprising: a pair of junction transistor units having an electrically common collector and emitter zone, two base zones separated by a narrow slot, and an emitter zone and a collector zone separated by said slot; the collector base junction of each unit having a greater area than that of its corresponding emitter base junction.

5. The method of making a multiple-unit transistor having an electrically common collector and emitter zone from a single junction transistor unit having an intermediate base zone and a pair of outer emitter and collector zones and having its emitter base junction symmetrically disposed with respect to its collector base junction comprising: forming a slot in said single transistor unit which extends obliquely through said intermediate base zone and one of said outer zones thereof.

References Cited in the file of this patent

UNITED STATES PATENTS

| | | |
|---|---|---|
| 2,663,806 | Darlington | Dec. 22, 1953 |
| 2,663,830 | Oliver | Dec. 22, 1953 |
| 2,666,814 | Shockely | Jan. 19, 1954 |
| 2,667,607 | Robinson | Jan. 26, 1954 |
| 2,735,948 | Sziklai | Feb. 21, 1956 |